United States Patent [19]

Kaplinsky

[11] Patent Number: 5,488,322

[45] Date of Patent: Jan. 30, 1996

[54] DIGITAL INTERFACE CIRCUIT WITH DUAL SWITCHING POINTS FOR INCREASED SPEED

[76] Inventor: Cecil H. Kaplinsky, 140 Melville Ave., Palo Alto, Calif. 94301

[21] Appl. No.: 297,641

[22] Filed: Aug. 29, 1994

[51] Int. Cl.⁶ .................................................. H03K 5/153
[52] U.S. Cl. ................................................ 327/74; 327/108
[58] Field of Search ................................ 326/17, 18, 31, 326/36; 327/50, 108, 58, 62, 74, 75, 76, 77, 85, 205, 206, 379, 383

[56] References Cited

U.S. PATENT DOCUMENTS

| | | | |
|---|---|---|---|
| 4,785,201 | 11/1988 | Martinez | 307/443 |
| 4,806,794 | 2/1989 | Walters, Jr. | 307/451 |
| 4,825,101 | 4/1989 | Walters, Jr. | 307/270 |
| 4,987,324 | 1/1991 | Wong et al. | 307/451 |
| 5,008,568 | 4/1991 | Leung et al. | 307/451 |
| 5,034,623 | 7/1991 | McAdams | 307/290 |
| 5,043,599 | 8/1991 | Zitta | 307/355 |
| 5,059,821 | 10/1991 | Murabayashi et al. | 307/360 |
| 5,165,046 | 11/1992 | Hesson | 307/270 |

Primary Examiner—Timothy P. Callahan
Assistant Examiner—Jeffrey Zweizig
Attorney, Agent, or Firm—Schneck & McHugh

[57] ABSTRACT

A buffer, driver, or level-shifting circuit having an input connected to signal inputs of a pair of comparators and an output connected between a pair of pull-up and pull-down transistors controlled by the comparators. A first reference voltage applied to the reference input of the comparator controlling the pull-up transistor is selected to be less than the nominal transition point of the circuit, while a second reference voltage applied to the reference input of the comparator controlling the pull-down transistor is selected to be greater than the nominal transition point of the circuit, thereby allowing the circuit to recognize the beginning of signal transitions on the its input sooner. The comparators are differential amplifiers which are enableable and disableable in response to a feedback signal from the circuit's output in order to reduce current consumption during transitions. When the output is high, the comparator controlling pull-down is enabled, while the comparator controlling pull-up is disabled. When the output is low, the comparator controlling pull-up is enabled, while the comparator controlling pull-down is disabled. Undershoot and overshoot control circuitry may be provided by replacing the single pull-up transistor, pull-down transistor, or both with pairs of parallel transistors whose combined conductance is comparable to that of the replaced transistor. One of the parallel transistors is turned off after the nominal transition point has been reached on the circuit's output, thus slowing pull-down or pull-up during the latter part of the transition when speed no longer matters.

10 Claims, 4 Drawing Sheets

DIGITAL INTERFACE CIRCUIT WITH DUAL SWITCHING POINTS FOR INCREASED SPEED

DESCRIPTION

1. Technical Field

The present invention relates to digital signal buffer, driver or level shifter circuitry in integrated circuits.

2. Background Art

A typical input circuit is composed of a pair of inverters, as shown by the CMOS buffer in FIG. 1. In that circuit, a first inverter is made up of a complementary pair of p-channel and n-channel field-effect transistors 11 and 13 connected in series between a pair of power supply terminals $V_{cc}$ and ground, with their gates connected in common to an input terminal IN and an output node 15 located between the two transistors 11 and 13. Likewise, a second inverter is made up of another pair of p-channel and n-channel field-effect transistors 17 and 19 also connected in series between the power supply terminals $V_{cc}$ and ground, and with their gates connected in common to the output node 15 of the first inverter and with an output terminal OUT connected between the two transistors 17 and 19. Transistors 11 and 13 are used to translate the voltage levels of the input signal, while transistors 17 and 19 provide current driving capabilities for large loads.

FIG. 2 shows the relative timing of input and output transitions from low to high logic states and from high to low logic states. It can be seen that the typical input circuit has a finite, non-zero transition time for both types of transitions, i.e. a pull-up time $t_{pu}$ and a pull-down time $t_{pd}$, due to the delays in the inverter stages from limitations in the switching speed and conductances of the transistors 11, 13, 17 and 19. Circuits of this type commonly have transition times of about 1.5 ns, and even the fastest circuits of this type still have transition times of about 1.0 ns.

One problem with the dual-inverter-type circuit of FIG. 1 relates to the variability of the input voltage at which a transition occurs. In a circuit where the power supply voltage $V_{cc}$ is 5 V, the nominal transition point may be defined at 1.5 V. That is, if the input is less than 1.5 V, it is considered to be low, and if it is greater than 1.5 V, it is considered high. However, in real circuits the actual transition point depends on the relative strengths of the n- and p-channel transistors and, therefore, may lie anywhere between 1.2 V and 1.8 V, depending on the process parameters for a particular batch of chips. Accordingly, in order to take these chip-to-chip variations into account, two measurement points are specified, defining a signal of less than 0.8 V as low, a signal of greater than 2.0 V as high, and a signal between 0.8 V and 2.0 V as neither high nor low. The actual transition point can then lie anywhere between 0.8 V and 2.0 V without affecting the operation of the circuit, since the circuit design takes the variability into account. However, the circuit design must also plan for the worst case and allow extra time to recognize a transition. For example, for a signal going from low to high, the actual transition point is allowed to be as high as 2.0 V, delaying the recognition of a high input signal until it has reached 2.0 V. Likewise, for a signal going from high to low, since the actual transition point could be as low as 0.8 V, the design must allow for the possibility that a transition of the input signal will not be recognized until the input has fallen to 0.8 V. This designing for the worst case does not allow for optimum use (in terms of speed) of such interface circuits and other circuit elements on the chip.

In U.S. Pat. No. 5,059,821, Murabayashi et al. describe a driver circuit having a complementary pair of bipolar output driver transistors and a pair of CMOS inverter predriver circuits whose outputs are connected to the respective output driver transistors to control their ON/OFF operation. The predriver circuits have different switching thresholds to reduce power consumption while maintaining high speed by ensuring that the two bipolar transistors are not both ON at the same time.

An object of the present invention is to provide a digital signal interfacing or transitional circuit operable as a buffer, driver, or level shifter, for coupling two circuits or two portions of a single circuit of the same or different logic families, and which is faster than the conventional dual-inverter-type circuits of the prior art without producing any significant ground bounce or consuming large amounts of power.

DISCLOSURE OF THE INVENTION

The object has been met with a circuit in which a pair of comparators using different reference voltages separately control the operation of a pair of transistors, one a pull-up transistor and the other a pull-down transistor. The reference points for the comparators have been selected relative to a nominal transition point for the circuit so as to speed up recognition of signal transitions on the circuit's input, which is connected to the signal inputs of the two comparators. In particular, the reference voltage for the comparator controlling the pull-up transistor is selected to be less than the nominal transition point of the circuit, while the reference voltage for the comparator controlling the pull-down transistor is selected to be greater than the nominal transition point of the circuit. Thus, in each case the signal transition is recognized before the nominal transition point is reached, so that pull-up or pull-down of the circuit's output begins sooner, decreasing the delay between the respective input and output signal transitions and thereby increasing the overall speed of the circuit.

Another aspect of the invention is that the comparators are enableable and disableable in response to an enable signal and means are provided in the circuit for enabling the first comparator controlling the pull-up transistor and disabling the second comparator controlling the pull-down transistor whenever the voltage state of the output of the circuit is low and for enabling the second comparator and disabling the first comparator whenever the voltage state of the output is high. This disabling of one of the comparators ensures that the pull-up and pull-down transistors, which would otherwise be both ON during periods when the input signal is at a voltage level between the two reference voltages of the comparators if both comparators were enabled at the same time, are instead only ON one at a time. Because the two transistors are never both ON simultaneously, large transition currents across the power supply terminals are eliminated, reducing power consumption.

BEST MODE OF CARRYING OUT THE INVENTION

A level-shifter (or level-translator) is a signal interface circuit that accepts digital input signals at one pair of voltage levels and delivers output signals at a different pair of voltage levels. Level shifters are often two-stage circuits having a first level shifting stage followed by a second driving stage. The driving circuit increases the power and current handling capabilities of a circuit so as to supply enough output current to overcome the capacitive load on the transmission line as well as the input impedance at the receiving end of the line.

Figure 1:
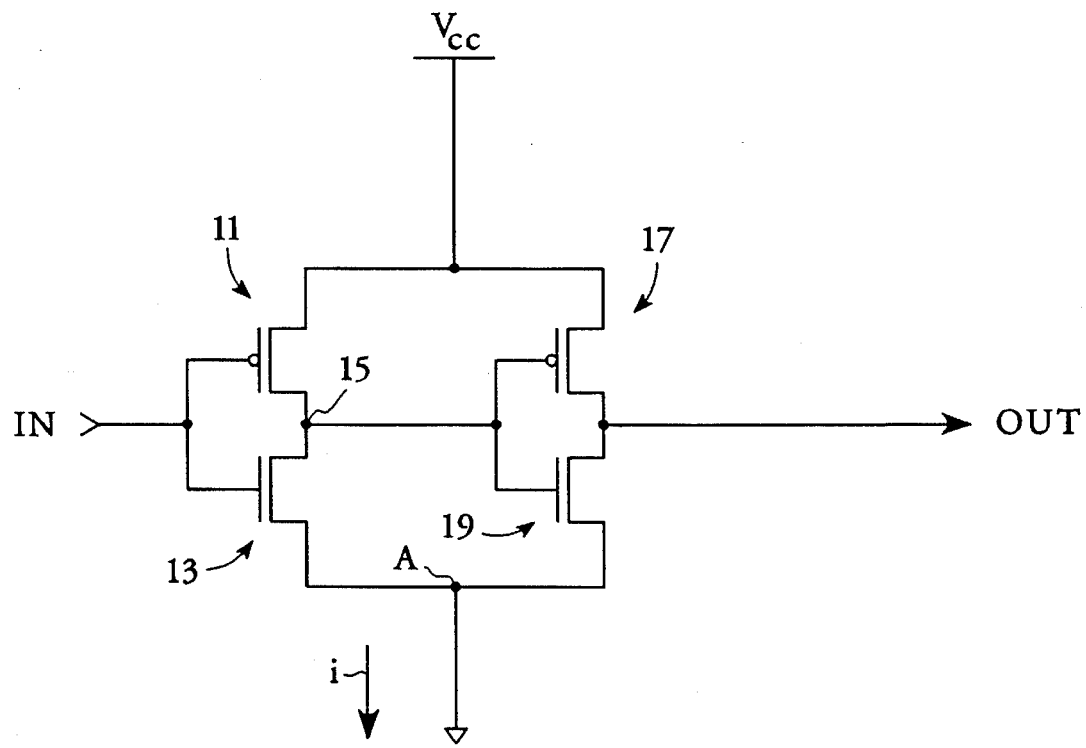
FIG. 1 is a schematic circuit diagram of a dual-inverter-type circuit of the prior art.
Figure 2:
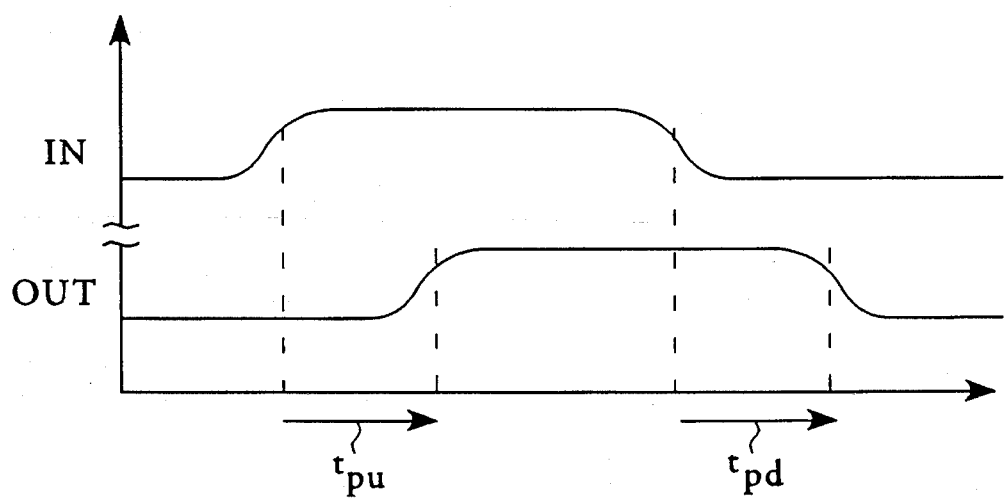
FIG. 2 is a graph of input and output signal levels versus time for a circuit like that in FIG. 1.
Figure 3:
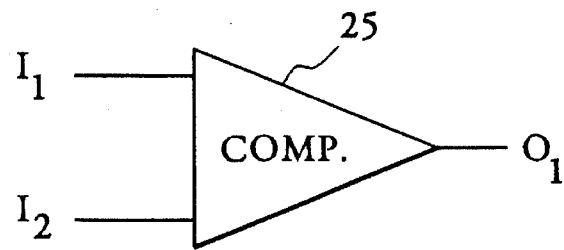
FIG. 3 is a schematic block diagram of a conventional comparator element.
Figure 4:
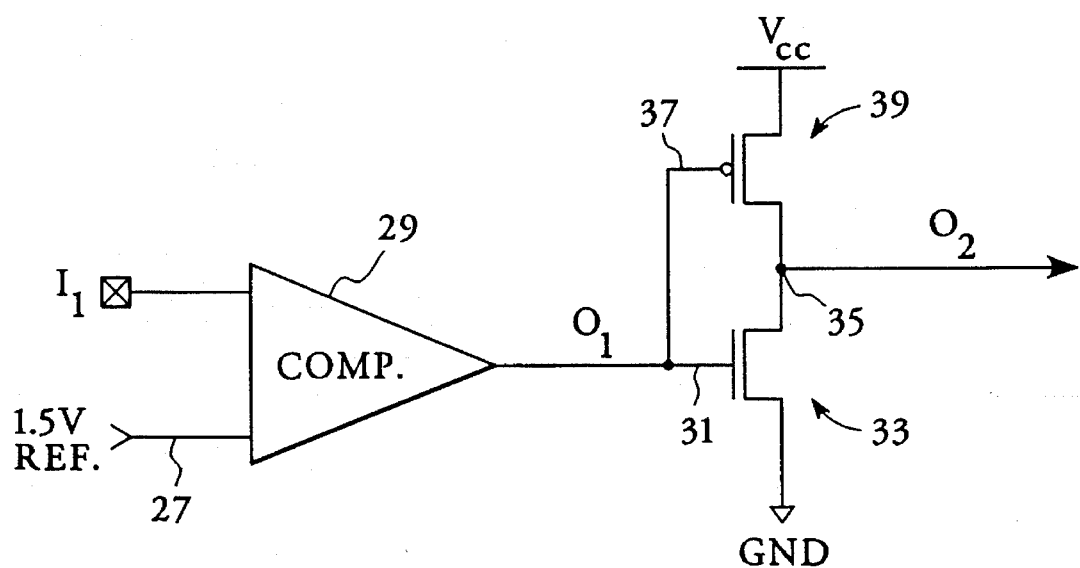
FIG. 4 is a schematic circuit diagram of a comparator-driven circuit illustrating a basic principle of operation of a circuit of the present invention.

Referring to FIG. 3, the interface circuit of the present invention makes use of comparators to control the pull-up and pull-down operation. A comparator 25 generally has two inputs $I_1$ and $I_2$ and an output $O_1$. If the signal voltage on input $I_1$ is less than that on the input $I_2$, then the comparator 25 provides a high logic level signal voltage on the output $O_1$. But if the signal voltage on input $I_1$ is greater than that on input $I_2$, then the comparator provides a low logic level signal voltage on the output $O_1$. The control operation of the comparator can be understood by reference to FIG. 4. In the circuit shown in FIG. 4, the $I_2$ input 27 to the comparator 29 is provided with a fixed reference voltage of 1.5 V. Thus, if the signal on input $I_1$ is less than 1.5 V, the comparator output $O_1$ will be high, but if the signal on input $I_1$ is greater than 1.5 V, the comparator output $O_1$ will be low. The comparator output $O_1$ drives the gate 31 of an n-channel transistor 33 functioning as a pull-down transistor between the output node 35 and a ground terminal GND and the gate 37 of a p-channel transistor 39 functioning as a pull-up transistor between the output node 35 and a power supply terminal $V_{cc}$. When the output $O_1$ is low, the transistor 33 will be off, transistor 39 will be on, and the output $O_2$ at node 35 will be pulled high. Likewise, when the comparator output $O_1$ is high, the output $O_2$ at node 35 will be pulled low. As a result, when the signal at input $I_1$ is less than 1.5 V, the output $O_2$ is low, and when the signal at input $I_1$ is greater than 1.5 V, the output $O_2$ is high.

Figure 5:
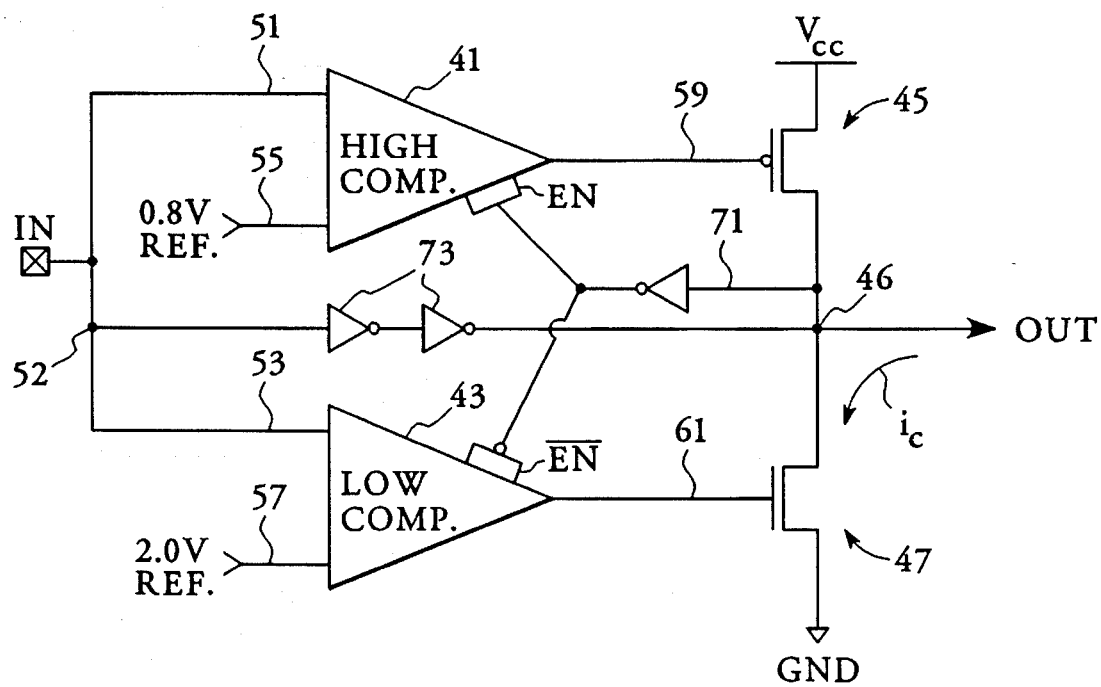
FIG. 5 is a schematic circuit diagram of an interface circuit of the present invention.

In order to speed up operation, the pull-up and pull-down circuitry in the present invention are separated. As seen in FIG. 5, the present invention uses two comparators 41 and 43, a first or "high" comparator for controlling a pull-up transistor 45 and a second or "low" comparator for controlling a pull-down transistor 47. Each comparator 41 and 43 has a signal input 51 and 53 connected in common to a circuit input IN to receive an input signal therefrom, and a reference input 55 and 57 to receive respective reference voltage signals. Each comparator 41 and 43 uses a different reference point. The high comparator 41 controlling pull-up receives a 0.8 V reference voltage on its reference input 55. The low comparator 43 controlling pull-down receives a 2.0 V reference voltage on its reference input 57. Thus, when the input signal IN on the high comparator's signal input 51 rises above the 0.8 V reference voltage, the comparator 41 recognizes that the input signal IN is no longer low, and outputs a low logic level signal on its output 59 and thereby turns on the p-channel pull-up transistor 45. Likewise, when the input signal IN on the low comparator's signal input 53 falls below the 2.0 V reference voltage, the comparator 43 recognizes that the input signal IN is no longer high, and outputs a high logic level signal on its output 61 and thereby turns on the n-channel pull-down transistor 47.

It can easily be seen that an n-channel transistor could replace the p-channel pull-up transistor 45, a p-channel transistor could replace the n-channel pull-down transistor 47, or both, provided the signal and reference inputs of the corresponding control comparator 41 or 43, or both, are interchanged so that the comparator outputs the opposite high or low logic level signal. What is important here is that the high comparator 41 have a reference point, such as 0.8 V, which is less than a nominal input transition voltage of the circuit (e.g., 1.5 V for a TTL circuit), and that the high comparator produce an output that turns on the pull-up transistor 45 whenever the input signal IN on the comparator input 51 rises above that reference point. Likewise, the low comparator 43 has a reference point, such as 2.0 V, which is greater than the nominal input transition voltage of the circuit, and it produces an output signal that turns on the pull-down transistor 47 whenever the input signal IN on the comparator input 53 falls below that reference point. For operation as a level shifter, the circuit can have reference voltages for the two comparators 41 and 43 which correspond to logic levels of the input signal of a first logic family, while the power supply terminals for the pull-up and pull-down transistors 45 and 47 can be at voltages that correspond to logic levels of the output signal of a second logic family.

Figure 6:
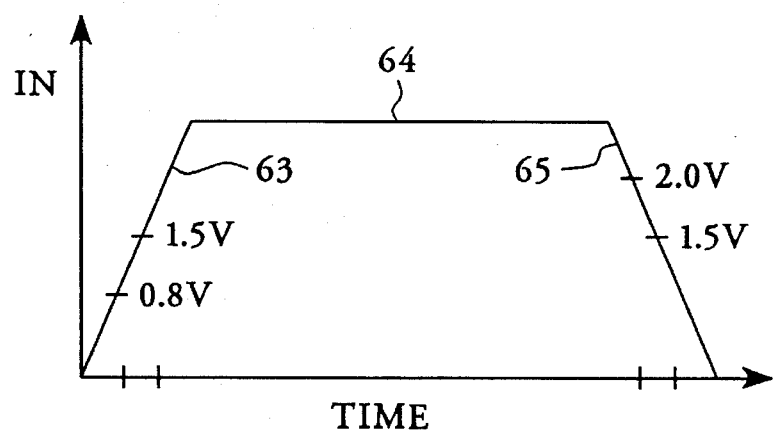
FIG. 6 is a graph of input signal voltage versus time illustrating the relationship between the reference voltages versus nominal transition voltage for the comparators in the circuit of FIG. 5.

As seen in FIG. 6, the interface circuit of the present invention gains time by recognizing transitions sooner. A representative input signal IN has a voltage that rises from ground (0 V) to $V_{cc}$ (3 V) in a first time period, represented by the rising edge 63, is high for a second time period, represented by the level voltage 64, and falls back to ground in a third time period, represented by the falling edge 65. It is important to note that neither the rise nor fall of the input signal voltage is instantaneous, but rather takes a finite amount of time. For example, the rise and fall times may be approximately 5 ns. It takes a first half of that time or about 2.5 ns to reach the nominal transition point of 1.5 V and another half of that time to complete the transition. The interface circuit of the present invention recognizes an input signal transition 63 from low to high when the input voltage has risen to just 0.8 V, which occurs after only the first 27% of the rise time. This is nearly twice as fast as a circuit that must wait until the nominal transition point is reached, and about two-and-a-half times faster than a worst case circuit that does not recognize the transition until the input signal has risen to 2.0 V, the defined lower limit for a high logic level. Likewise, the interface circuit of the present invention recognizes an input signal transition 65 from high to low when the input voltage has fallen to 2.0 V, which occurs after only the first 33% of the full time. This is just two-thirds of the time required to reach the nominal transition point of 1.5 V, and more than twice as fast as the worst case circuit that waits until the input signal has fallen below the defined upper limit of 0.8 V for a low logic level. Transition times of about 1.5 ns can be obtained with the present circuit.

Referring again to FIG. 5, the period when the input voltage is between 0.8 V and 2.0 V is a time when both the pull-up transistor 45 and the pull-down transistor 47 would be on, if both comparators 41 and 43 were enabled at the same time. Since the input signal IN has a voltage greater than the 0.8 V reference voltage on input 55, the high comparator 41 would output a low logic level signal driving the p-channel pull-up transistor 45 to conduct. Likewise, since the input signal IN also has a voltage less than the 2.0 V reference voltage on input 57, the low comparator 43 would output a high logic level signal driving the n-channel pull-down transistor 47 to conduct. Current flow between the power supply terminals $V_{cc}$ and GND across both fully active transistors 45 and 47 would be even larger than in a simple inverter. To eliminate such potentially large transition currents, the interface circuit of the present invention uses a feedback path 71 from the circuit's output node 46 located between the transistors 45 and 47 to the comparators 41 and 43 to shut off one comparator. In particular, each comparator 41 and 43 is enableable and disableable in response to an enable signal provided on the feedback path 71. If the output signal OUT at output node 46 is low, then the high comparator 41 controlling the pull-up transistor 45 is enabled and the low comparator 43 controlling the pull-down transistor 47 is disabled. This keeps the pull-down transistor 47 off during an input signal rise requiring only operation of the pull-up transistor 45. Likewise, if the output signal OUT is high, then the low comparator 43 controlling the pull-down transistor 47 is enabled and the high comparator 41 controlling the pull-up transistor 45 is disabled. In this case, the pull-up transistor remains off since the output is already high and only pull-down is required in the event of a signal transition from high to low. Small anti-drift buffers 73 may be connected between the circuit's input node 52 receiving the input signal IN and the output node 46 to keep the output signal OUT at its established high or low level during non-transition periods when both transistors 45 and 47 are off.

Figure 7:
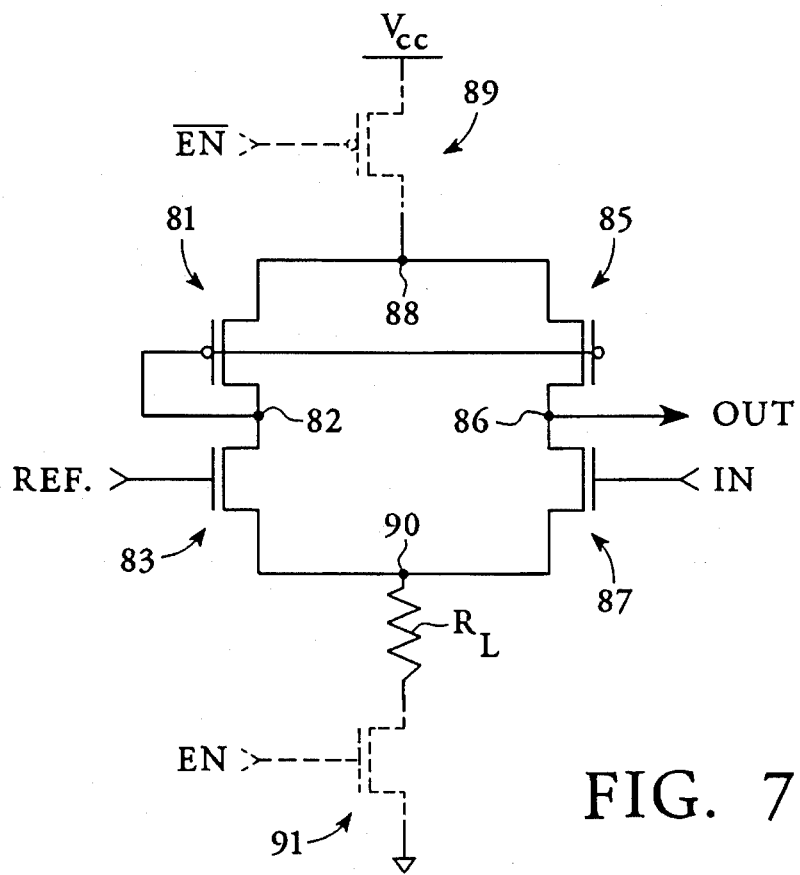
FIG. 7 is a schematic circuit diagram of a comparator for driving the circuit of FIG. 5.

With reference to FIG. 7, an enableable and disableable comparator circuit for use in the interface circuit of the present invention is seen to be a CMOS differential amplifier having a first p-channel field-effect transistor 81 connected in series to a first n-channel field-effect transistor 83 at a node 82, and a second p-channel field-effect transistor 85 connected in series to a second n-channel field-effect transistor 87 at an output node 86, with the two p-channel transistors 81 and 85 coupled together through a node 88 to a first power supply terminal $V_{cc}$ and with the two n-channel transistors 83 and 87 coupled together through a node 90 and via a resistive load element $R_L$ to a ground terminal. The gates of the two p-channel transistors 81 and 85 are commonly connected to the node 82 between the first p-channel and n-channel transistors 81 and 83, while the gates of the two n-channel transistors 83 and 87 are driven by the reference voltage signal REF and the input signal IN, respectively. The comparator output signal OUT is provided at output node 86 between the second p-channel and n-channel transistors 85 and 87. The reference voltage signal REF provided to the gate of transistor 83 for the high comparator 41 in FIG. 5 controlling the pull-up operation of the circuit is 0.8 V, while a reference voltage signal REF for the low comparator 43 controlling pull-down operation is 2.0 V.

Enablement and disablement of one of the comparators is effected by an additional transistor 89 or 91. For the low comparator 43 in FIG. 5, a p-channel transistor 89 is connected between the node 88 and the power supply terminal $V_{cc}$. When the output node 46 in the circuit of FIG. 5 is high, the enable signal EN applied to the gate of the enable transistor 89 is low, so that transistor 89 is on and the power supply terminal $V_{cc}$ is connected to the comparator, enabling control of pull-down operation of the circuit. In the low comparator 43, the resistive load element $R_L$ is connected directly to the ground terminal. For the high comparator 41 in FIG. 5, an n-channel transistor 91 is connected between the resistive load element $R_L$ and the ground terminal, while the node 88 is directly connected to the power supply terminal $V_{cc}$. When the output node 46 in FIG. 5 is low, the enable signal EN applied to the gate of the enable transistor 91 is high, so that transistor 91 is on and the ground terminal is connected to the comparator 41, enabling control of pull-up operation of the circuit. It can further be seen that due to the opposite conductivity types of the two enable transistors 89 and 91 in the respective low and high comparators 43 and 41, that only one comparator is enabled at any one time. It can easily be seen that in combination with the appropriate polarity of the enable signal on the feedback path 71 from the output node 46, the conductivity types of the enable transistors 89 and 91 can be reversed. For use in level-shifting circuits, the enable transistors 89 and 91 respond to the pair of output voltage levels of one logic family, while the comparator itself compares the input signal IN of a different logic family with a reference voltage REF that corresponds to the voltage levels of that input logic family.

Figure 8:
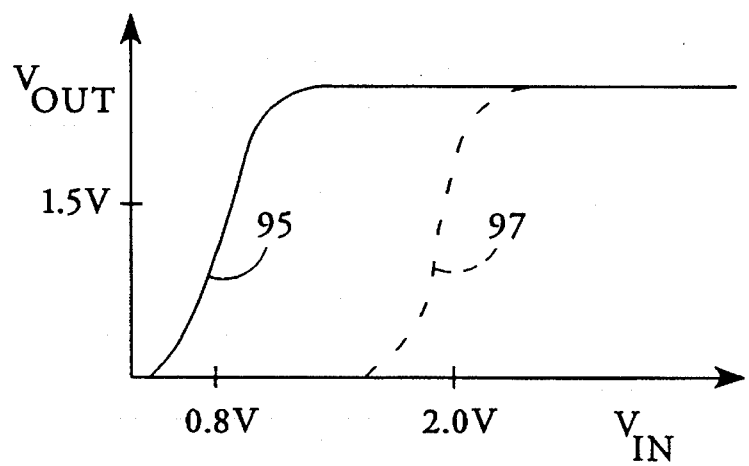
FIG. 8 is a graph of output voltage versus input voltage in the circuit of FIG. 5 for pull-up (solid curve) and pull-down (dashed curve).

With reference to FIG. 8, the circuit of FIG. 5 using the enableable and disableable comparators of FIG. 7 exhibits hysteresis in its relation between the circuit's input voltage $V_{IN}$ and the circuit's output voltage $V_{OUT}$. For low-to-high transitions, when the high comparator 41 is enabled and the low comparator 43 is disabled, the transition from low-to-high of the output voltage $V_{OUT}$ occurs at 0.8 V for the input voltage $V_{IN}$, as seen by solid curve 95. For high-to-low transitions, when the high comparator 41 is disabled and the low comparator 43 is enabled, the output voltage follows the dashed curve 97 with the transition occurring at an input voltage of 2.0 V.

Figure 9:
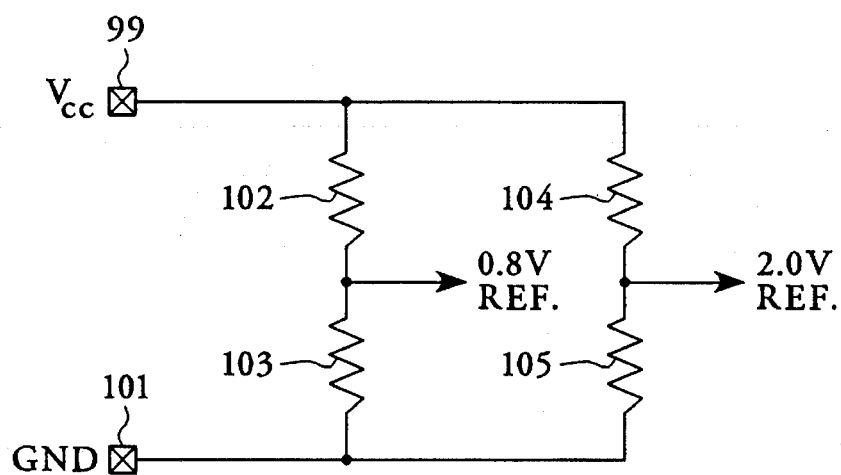
FIG. 9 is a schematic circuit diagram of a reference voltage generating circuit for the comparator of FIG. 7.

With reference to FIG. 9, the reference inputs REF to the respective comparators are preferably generated using separate power supply and ground pins 99 and 101 from those used for the other elements of the interface circuit. This makes the reference points independent of the current use by the rapid switching elements of the circuit. Resistors 102–105 between the power supply and ground pins 99 and 101 form voltage dividers, which produce the required 0.8 V and 2.0 V reference voltages. Alternatively, a voltage reference circuit that employs the same power supply and ground as the other elements of the interface circuit could be used.

The interface circuit of the present invention achieves high speed operation which is much faster than the prior conventional dual-inverter-type circuits. The invention should not be understood as only limited to circuits which merely serve to isolate the current paths between two circuits or between different portions of the same circuit while transmitting an input signal to the output of the circuit, but rather is meant to include driver circuits that take an input signal of relatively low power and provide a corresponding output signal of higher power able to drive a load. Further, level shifting circuits connecting two circuits of different logic families having different sets of signal voltage levels are contemplated as included within the invention, with suitable modification to the circuits used in the examples given above. In the latter case, the comparators operate to interpret the input signal levels and control pull-up and pull-down transistor elements operating at output signal levels which may differ from the input signal levels.

I claim:

1. A circuit, comprising a pull-up transistor and a pull-down transistor connected in series between a pair of power supply terminals, a node between said pull-up and pull-down transistors constituting a circuit output, means, connected to a circuit input and to a control terminal of said pull-up transistor, for effecting pull-up operation of said pull-up transistor whenever an input signal received from said circuit input exceeds a first reference voltage less than a nominal transition voltage, means, connected to said circuit input and to a control terminal of said pull-down transistor, for effecting pull-down operation of said pull-down transistor whenever said input signal received from said circuit input falls below a second reference voltage greater than said nominal transition voltage, means for disabling said means for effecting pull-up operation whenever a voltage at said circuit output is greater than said nominal transition voltage and for disabling said means for effecting pull-down operation whenever said voltage at said circuit output is less than said nominal transition voltage, and a low-conductance antidrift buffer connected between said circuit input and said circuit output.

2. The circuit of claim 1 wherein said means for effecting pull-up operation is a first comparator and said means for effecting pull-down operation is a second comparator, said comparators having respective signal inputs connected in common to said circuit input, and having reference inputs connected to a reference voltage generating circuit to receive said respective first and second reference voltages.

3. The circuit of claim 2 wherein each comparator includes an enable transistor coupling said comparators to said power supply terminals, said enable transistor for each comparator having a control terminal responsive to a feedback signal provided from said circuit output to isolate a selected one of said comparators from said power supply terminals and thereby disable said selected comparator.

4. A circuit, comprising a pull-up transistor and a pull-down transistor connected together in series between a pair of power supply terminals with a circuit output located at an output node between said pull-up transistor and said pull-down transistor, a first comparator and a second comparator, each comparator having a reference input, a signal input and a comparator output, the signal inputs of both comparators connected to a circuit input to receive an input signal therefrom, the reference input of said first comparator receiving a first reference voltage which is less than a nominal transition voltage of the circuit, the reference input of said second comparator receiving a second reference voltage which is greater than the nominal transition voltage of the circuit, the comparator output of said first comparator connected to a control terminal of said pull-up transistor, the comparator output of said second comparator connected to a control terminal of said pull-down transistor, each comparator being enableable and disableable in response to an enable signal, means, connected to said output node and to said first and second comparators, for enabling said first comparator and disabling said second comparator whenever a voltage state on said output node is low, and for enabling said second comparator and disabling said first comparator whenever the voltage state on said output node is high, and a low-conductance dual-inverter antidrift buffer connected between said circuit input and said circuit output.

5. The circuit of claim 4 wherein said pull-up transistor is a p-channel MOS field-effect transistor and said pull-down transistor is an n-channel MOS field-effect transistor.

6. The circuit of claim 4 wherein said first and second reference voltages received by said reference inputs of said comparators are generated by a reference voltage generating circuit connected to said reference inputs.

7. The circuit of claim 6 wherein said reference voltage generating circuit includes a pair of voltage divider circuits respectively generating said first and second reference voltages, said pair of voltage divider circuits are connected to a different set pair of power supply terminals than said power supply terminals connected to said pull-up and pull-down transistors.

8. The circuit of claim 4 wherein each of said first and second comparators comprises a differential amplifier in which differential inputs of each amplifier are said reference input and said signal input of one said comparator.

9. The circuit of claim 8 wherein each differential amplifier includes an enable transistor coupled to one of said power supply terminals, and responsive to a first signal level on a control terminal of said enable transistor to connect said differential amplifier to said power supply terminal and responsive to a second signal level on said control terminal of said enable transistor to isolate said differential amplifier from said power supply terminal, whereby each said comparator formed by one said differential amplifier is enableable and disableable.

10. The circuit of claim 4 wherein said first reference voltage is 0.8 V and said second reference voltage is 2.0 V, said nominal transition voltage being 1.5 V.

* * * * *